US007390531B2

(12) United States Patent
Burmeister et al.

(10) Patent No.: US 7,390,531 B2
(45) Date of Patent: Jun. 24, 2008

(54) METHOD FOR PRODUCING A TOOL WHICH CAN BE USED TO CREATE SURFACE STRUCTURES IN THE SUB-μM RANGE

(75) Inventors: Frank Burmeister, Gundelfingen (DE); Walter Döll, Reute (DE); Günter Kleer, Buchenbach (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 793 days.

(21) Appl. No.: 10/343,979

(22) PCT Filed: Aug. 9, 2001

(86) PCT No.: PCT/EP01/09232

§ 371 (c)(1),
(2), (4) Date: Oct. 14, 2003

(87) PCT Pub. No.: WO02/12586

PCT Pub. Date: Feb. 14, 2002

(65) Prior Publication Data
US 2004/0052946 A1    Mar. 18, 2004

(51) Int. Cl.
*B05D 5/06* (2006.01)

(52) U.S. Cl. .................. 427/162; 427/164; 427/165; 427/166; 427/167; 427/168; 427/169

(58) Field of Classification Search .............. 427/162, 427/164, 165, 166–169
See application file for complete search history.

(56) References Cited

U.S. PATENT DOCUMENTS

| 4,865,873 A | 9/1989 | Cole, Jr. et al. |
| 6,075,652 A | 6/2000 | Ono et al. |

FOREIGN PATENT DOCUMENTS

DE    2944404    5/1980

(Continued)

OTHER PUBLICATIONS

Gombert, et al., "Subwavelength-Structured Antireflective Surfaces on Glass", Thin Solid Films 351 (1999) pp. 73-78.

(Continued)

*Primary Examiner*—Alain L. Bashore
(74) *Attorney, Agent, or Firm*—Antonelli, Terry, Stout & Kraus, LLP.

(57) ABSTRACT

The invention is a method for producing a tool which can be used to create optically active surface structures in the sub-μm range, having a support surface onto which relief surface structures are applied over the support surface by means of material deposition. The invention is distinguished by the support surface being directly contacted with a mask in which openings with diameters in the sub-μm range are provided or can be provided, by the support surface including the mask being subjected to a coating process in which the coating material deposits through the openings of the mask onto the support surface, and the mask is removed from the support surface when a partial amount of an average end structure height of the surface structures is reached and the coating procedure is then continued without the mask using the same coating material or different coating materials.

12 Claims, 4 Drawing Sheets

| | FOREIGN PATENT DOCUMENTS | | |
|----|----|----|----|
| DE | 69124477 | 6/1992 | |
| DE | 19708776 | 6/1998 | |
| DE | 19922054 | 11/1999 | |
| GB | 653396 | 5/1951 | |
| WO | 97/39159 | 10/1997 | |

OTHER PUBLICATIONS

Frazier, et al., Uses of Electroplated Aluminum for the Decelopment of Microstructures and Micromachining Processes, Journal of Microelectromechanical Systems, vol. 6, No. 2, Jun. 1997, pp. 91-98.

METHOD FOR PRODUCING A TOOL WHICH CAN BE USED TO CREATE SURFACE STRUCTURES IN THE SUB-µM RANGE

BACKGROUND OF THE INVENTION

1. Field of the Invention

The present invention relates to a method for producing a tool which can be used to create optically active surface structures in the sub-µm range, having a support surface onto which relief surface structures are applied by means of the deposition of materials. Furthermore, a corresponding tool is described.

2. Description of the Prior Art

In many light-optical applications, reflections of light have a disturbing and energy-diminishing effect on technical and optical surfaces and interfaces. For example, the readability of displays is distinctly impaired by the reflection of external light sources. Furthermore, in the case of glazed solar cell modules, reflection losses occur on the cover thereby considerably reducing the solar cell's efficiency.

To decrease reflection and increase transmission, technically complicated single layer or multi-layer systems have hitherto been applied to the surfaces in order to diminish reflection from them. These surface finishes are, however, not only expensive but also unsatisfactory, because their effect depends largely on the angle of incidence and the wavelength of the light impinging on the surfaces.

Most recent antireflective methods for reducing reflection pursue a different approach, notably to design the transition in the refractive index at the surface of each optical component and to not vary abruptly but rather vary continuously. In order to do this, each surface is "roughened" and structured in order to copy the "moth-eye effect" known from nature. In designing such type surface structures, the average lateral dimensions of each structure must be distinctly smaller than the wavelength of the incident light in order to prevent the light from scattering and the increased diffuse reflection accompanying it. Furthermore, for an effective reduction of reflection, it is necessary that the structures have an aspect relationship, that is the relationship between the vertical to the lateral dimensions of the surface structures, in the magnitude of 1 or higher.

The production of such type surface structures with suitably shaped tool surfaces using hot stamping or injection molding processes by, for example, heating an optical element for surface coating by means of hot stamping until above the glass melting temperature of the material of which it is composed and structuring it at its surface accordingly with a stamping tool bearing a negative image of the microstructuring. Such types of stamping tools with a microstructured stamp can be made of nickel using galvanic methods, in which periodic surface microstructures can be obtained using photolithographic techniques. Such types of periodic surface structures are very efficient in their optical effect and far superior to the prior art stochastically distributed microstructure surfaces. They, however, have the drawback that they are produced with nickel. However, such types of stamps, also called "masters", possess low high-temperature resistance due to the material they are made of, and can therefore only be utilized for shaping the surface of organic glasses, such as for example optical elements made of PMMA. Moreover, the lifetime of such nickel master tools is short as distinct wear can be observed with repeated use due to their material.

Finally, the production method of periodic structures using photolithography has the disadvantage that open surfaces or aspherical surfaces, often needed in technology, cannot be structured.

Milled steel tools coated with a layer of mechanically resistant, high-temperature resistant, ceramic material are prior art for the aforedescribed tools for transferring periodic structures onto preferably optical surfaces. With a suitable selection of layer deposition parameters, these layers fulfill basically the aforeset requirements with regard to the aspect relationship and the lateral dimensions of the microstructures but not with regard to the regular, periodic arrangement of the surface structures as is the case with the aforementioned nickel master stamps.

Due to the non-periodicity of the microstructures applicable in the layers of mechanically resistant ceramic materials, these surface structures are called stochastic surface structures. In these stochastic surface structures not only the lateral arrangement of the single elements of the structure in the mechanically resistant ceramic material are irregular, but the quite varied growth of the single elements of the structure can be observed. The presence of large structural elements within the microstructure surface, however, leads to an undesiderable increase in diffuse reflection and at the same time to a decrease in direct reflection when being formed. With reference to this see: A. Gombert, W. Glaubitt, K. Rose, J. Dreibholz, B. Bläsi, A. Heinzel, D. Sporn, W. Döll, V. Wittwer, "Subwavelength-Structured Antireflective Surfaces on Glass", Thin Solid Films 351 (1999), No. 1-2, pp. 73-78.

The article "Fabrication of a Micro-Patterned Diamond Film by Site-Selective Plasma Chemical Vapor Deposition", by Sakamoto et al., Thin Solid Films, Elsevier-Sequoia S. A. Lausanne, C H, vol. 334, No. 1-2, 4 Dec. 1998 (Dec. 4, 1998), pp. 161-164, ISSN: 0040-6090, describes a method of selective coating of substrates with a diamond film. Such types of substrates provided with diamond film structures are used in promising applications in technology, such as for example in micro-electronics for field effect transistors. In order to obtain selective diamond depositions with dimensions of the structures in the sub-µm range, a property of diamond is utilized that it deposits on a platinum layer with approximately a $10^4$ greater affinity than, for example, on a $SiO_2$ surface. If suited platinum structures are provided on a substrate surface, all that is needed is full-surface PVD coating of such a type of pre-structured $SiO_2$ substrate with diamond, which only deposits significantly on the Pt-structured areas. The selective, diamond coated substrate yielded by this method meets microelectronic needs, but it cannot be used as a heat-resistant tool, in the sense described in the introduction, due to the purposely selective coating.

SUMMARY OF THE INVENTION

The present invention is a method for producing a tool and to provide the tool which can be utilized for fabricating optically active surface structures in the sub-µm range and which has a support surface on which relief surface structures are applied over the support structure by means of material deposition that, on the one hand, prevents the drawbacks arising with the aforedescribed stochastic surface structures, that is undesirable high diffuse and direct reflection, and, on the other hand, nonetheless ensures utilizing the tool under high temperatures in order to be able to provide antireflective optical or technical surfaces made of not only organic materials but also of inorganic materials with it.

According to the present invention, a method for producing a tool is disclosed, which can be used to create optically active surface structures in the sub-μm range and which has a support surface formed or processed to a desired macroscopic contour on which relief surface structures are applied by means of material deposition over the support surface, is further developed in such a manner that the support surface is directly contacted with a mask which is provided or can be provided with openings with diameters in the sub-μm range. Then the support surface with the mask is subjected to a coating process in which the coating material is also deposited through the openings of the mask onto the support surface. Upon reaching a partial amount of an average height of an end structure of the desired surface structures, the mask is removed from the support structure and the coating procedure is then continued without the mask. The partial surface structures formed directly after removal of the mask are used as growth or crystallization seeds for the continued coating procedure by means of which material deposition and further crystal growth occurs preferably at the crystallization seeds.

A particularly favorable time to remove the mask from the support surface is reached when the developing elements of the surface structures have reached approximately 0.5% to 80% of their desired end height.

By dividing the coating procedure into two parts, single surface structure elements are obtained whose lateral structure dimensions diminish with increasing height of the structure due to the subsequent, preferred material deposition on the coating seeds. In this manner, column-like formations with diminishing diameters are formed as surface structures on the support surface. In this manner protrusions can be completely avoided so that transfer of the surface structure onto optical or technical surfaces is readily possible in a molding procedure.

The arrangement with which the individual surface structure elements are deposited on the support surface is determined by the arrangement of the openings in the mask. In the simplest case, a layer of conventional photoresist varnish applied uniformly onto the support surface serves as the mask material. With the aid of suitable photolithographic exposure techniques, openings of any desired size and distribution can be exposed into the photosensitive varnish layer in dependence on the exposure patterns.

Another possible way to produce the desired mask uses an aqueous suspension in which the colloidal, bead-shaped particles are dispersed and which are applied to the support surface. After a drying process, the colloidal particles remaining on the support surface form the mask layer with wide gaps between the particles corresponding to the openings through which material deposition forming the aforedescribed surface elements can occur. Further details for producing such a mask layer are given in the following sections of the description with reference to the accompanying drawings.

Especially suitable as materials for forming the surface structure are the following elements: Ti, Al, Zr, Cr, Mo, Ni, W, Si B, and C as well as mixtures of elements of the just listed examples of elements. Furthermore, at least one of the layer-forming elements may be at least partially oxidized or nitrated.

Suitable as materials for developing crystallization seeds in the first coating step are, in addition to the aforementioned elements, particularly also Ag, Au, Pd, Pt.

With the aid of such a coating, it is possible to produce a high-temperature resistant layer which can withstand even temperatures up to over 850° C. and permits molding of the surface structure on optical or technical surfaces made not only of organic, preferably, light-transparent plastics but, in particular, also structures composed of inorganic materials, such as glass.

BRIEF DESCRIPTION OF THE DRAWINGS

The invention is made more apparent in the following using preferred embodiments with reference to the accompanying drawings by way of example without the intention of limiting the scope or spirit of the overall inventive idea.

DESCRIPTION OF THE PREFERRED EMBODIMENTS

Figure 1:
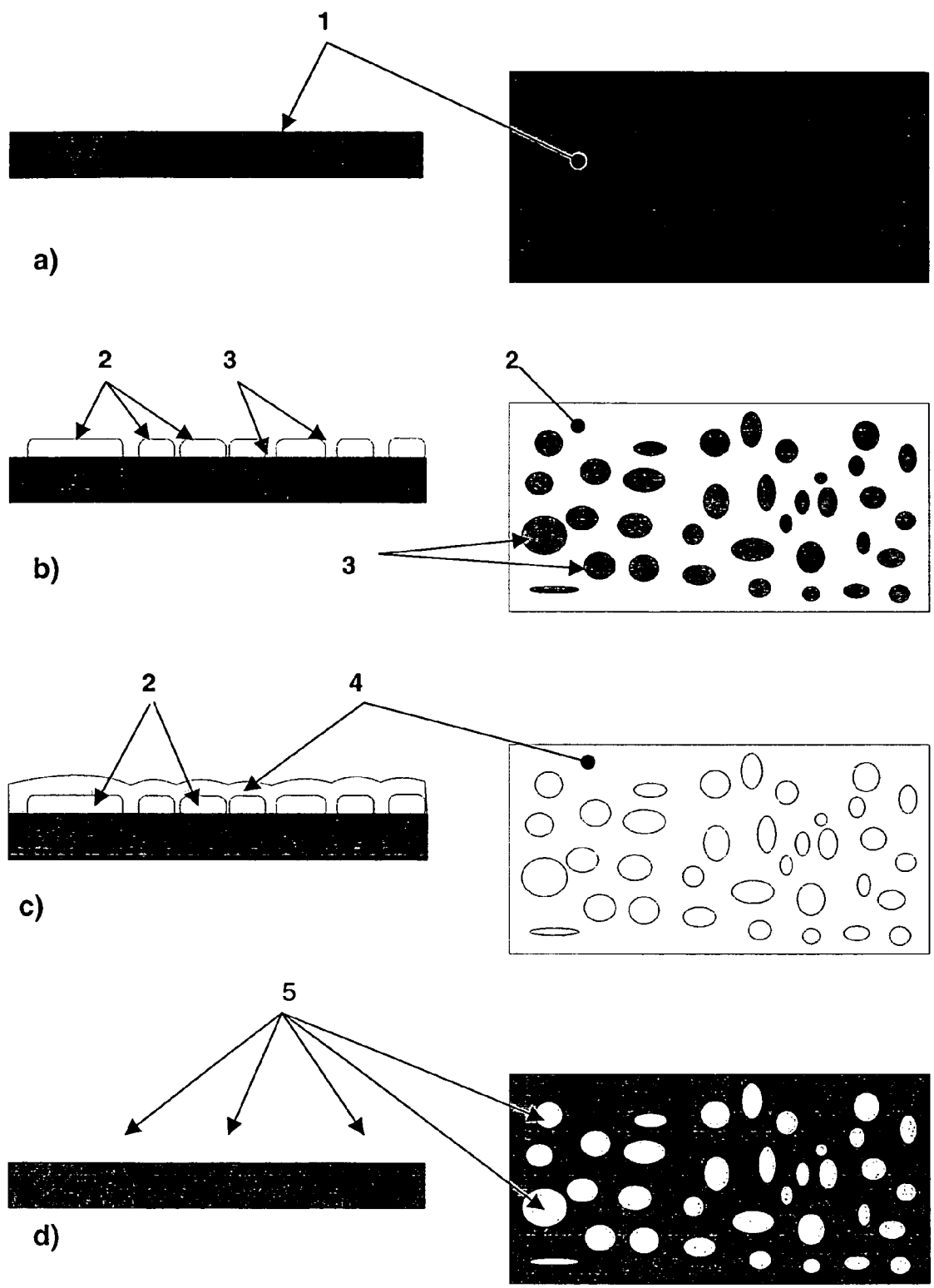
FIGS. 1a) to d) show a schematic for producing surface structures on a support surface.

FIGS. 1a) to d) show on the left a lateral view and on the right a top view of the respective steps of the method. FIG. 1a depicts a lateral and a top view of the support of a tool, with a support surface 1 which is to be selectively coated. In FIG. 1b), a mask 2, which is provided with a multiplicity of openings 3 where the support surface 1 is surrounded free of the material of mask 2, is placed directly on the support surface 1. The mask material 2 can, for example, comprise a photoresist, which is removed locally and selectively at the sites of openings 3 after corresponding exposure and the subsequent etching process. Depending on the manner of exposure, the openings 3 form in a specific configuration within the mask 2. A top view of FIG. 1b) shows an example of opening geometry and a corresponding configuration. The openings 3 represent dark areas on the support surface with the remaining white areas being covered by the mask material 2.

The mask 2 provided with openings 3 is then coated in a subsequent coating procedure in which particularly high-temperature resistant materials are deposited, preferably with the aid of a PVD process. In FIG. 1c), the mask 2 and the openings 3 are covered by a coating material 4, which deposits directly onto the support surface 1 particularly inside the openings 3. The coating of support surface 1 and the mask 2 can be interrupted as soon as the height of the coating inside the openings 3 reaches a level corresponding to approximately 0.5% to 80% of the average projected end structure height of the individual elements of the surface structure. When such a layer thickness is reached, mask 2 and the layer 4 are removed from support surface 1 with the aid of selective etching techniques. The material deposits 5 remain as single surface structure elements which have deposited directly on the support surface inside the openings 3, as FIG. 1d) shows both in a lateral view and a top view. Then the coating process is continued and the surface structure elements 5 remaining on the support surface 1 after removal of the mask serve as coating seeds as shown in FIG. 2. In the further course of the coating process, the coating material is deposited on the entire support surface but deposited with preferred growth of the single structures in the region of the seeds.

The surface structures created with the aid of the aforedescribed method usually have, depending on the openings 3 inside the mask 2, 6 to 400 surface structure elements per μm². Moreover, the single elements of the structure are usually spaced between 50 and 400 nm apart.

Especially good properties can be obtained if the surface structure has single surface structure elements whose respective size and shape can be divided into at least two different groups of surface structure elements. Fundamentally, the structure elements of one group are larger than those of the other group. Furthermore, the lateral spaces of the centers of the single structure elements are distributed approximately at least two characteristic, average distances M1 and M2. The following relationships have proven particularly advantageous for these two average distances: the value $M_1$ should lie in a region between 50 nm and 180 nm, whereas the average distance $M_2$ has values between 200 nm and 400 nm. Especially good results are yielded, for example, if $M_1$=170 nm and $M_2$=300 nm. Furthermore, it was discovered that the relationship of $M_2$ and $M_1$ should preferably be greater than 1.1 and smaller than 8, in particular 1.72.

Figure 2:
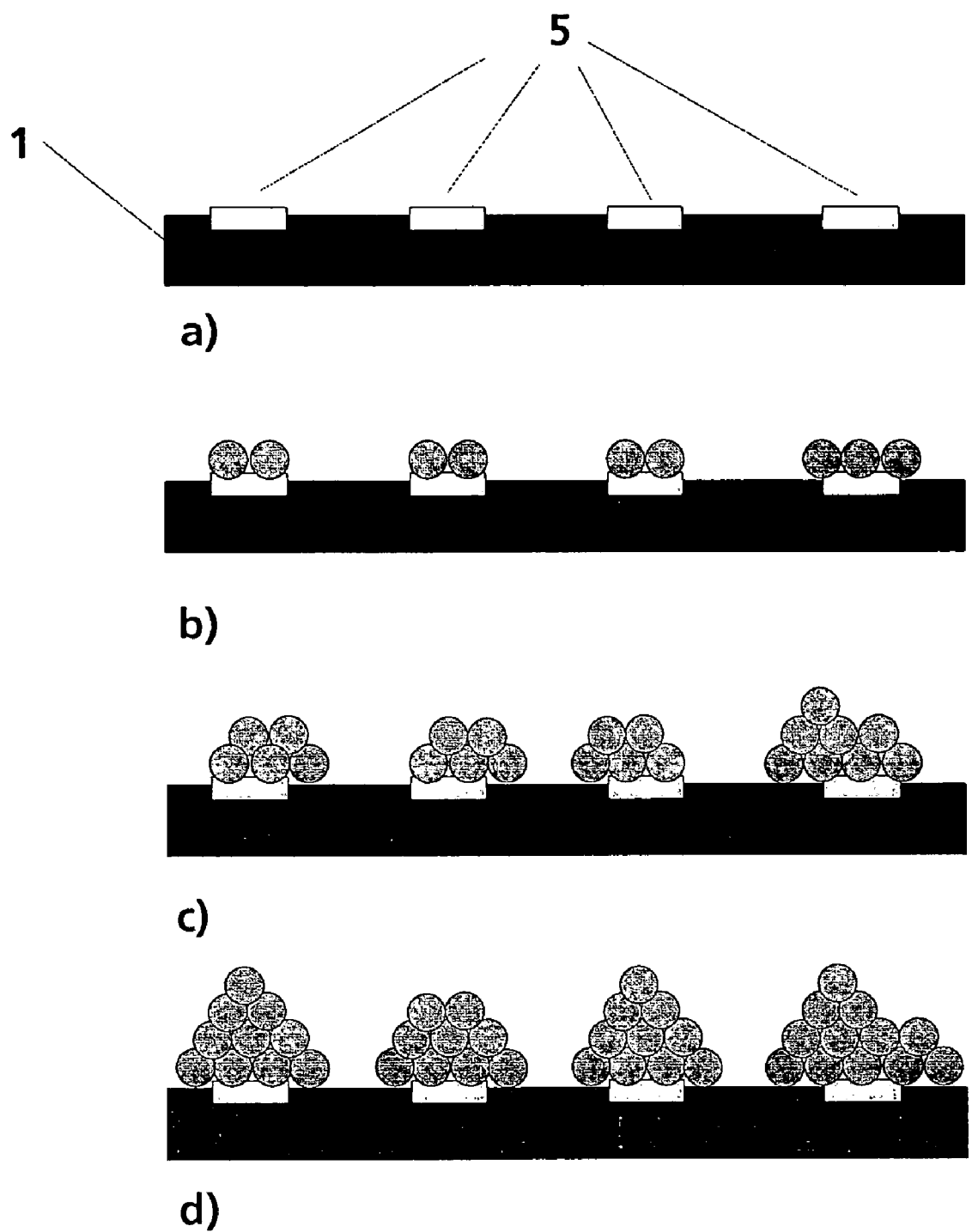
FIG. 2 shows a representation of surface structure elements on the support surface.
Figure 3:
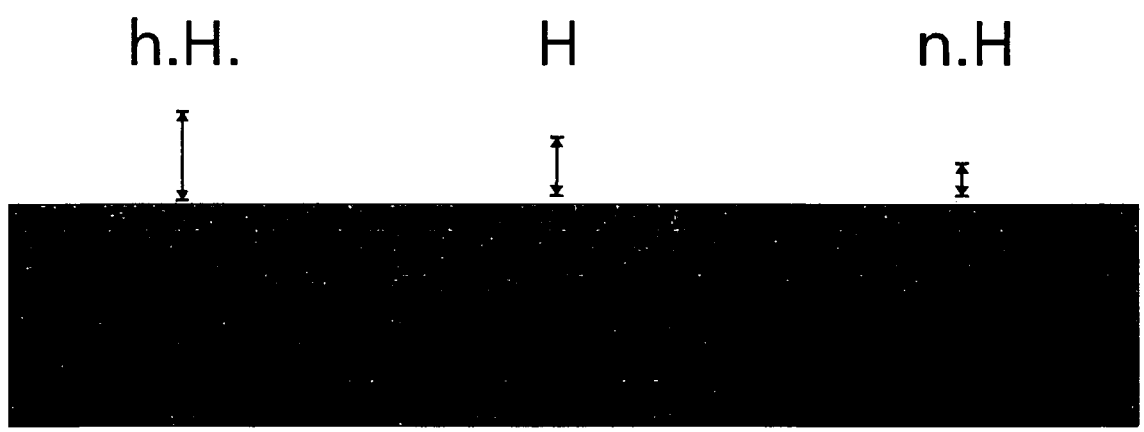
FIG. 3 shows a cross section of a coated support surface bearing surface structure elements.

FIG. 3 shows a cross section of a tool with a support surface 1, which can preferably be created out of a metallic material, in particular out of a steel or out of ceramic materials or out of silicon. A multiplicity of surface structure elements 5 illustrated in FIG. 2, which are shaped column-like and taper upward, are deposited onto the support surface 1. Provided between the single surface structure elements 5 of FIG. 2 are material deposits also in different coating heights due to the continued coating procedure. The surface structure elements preferably have heights whose highest heights h.H. in relation to the respective surrounding lowest layer height differs by the factor 1.6 from the lowest surface structure elements n.H. in the layer. Furthermore, the single surface structure elements 5 illustrated in FIG. 2 preferably have structure heights H lying between 50 and 1000 nm.

Figure 4:
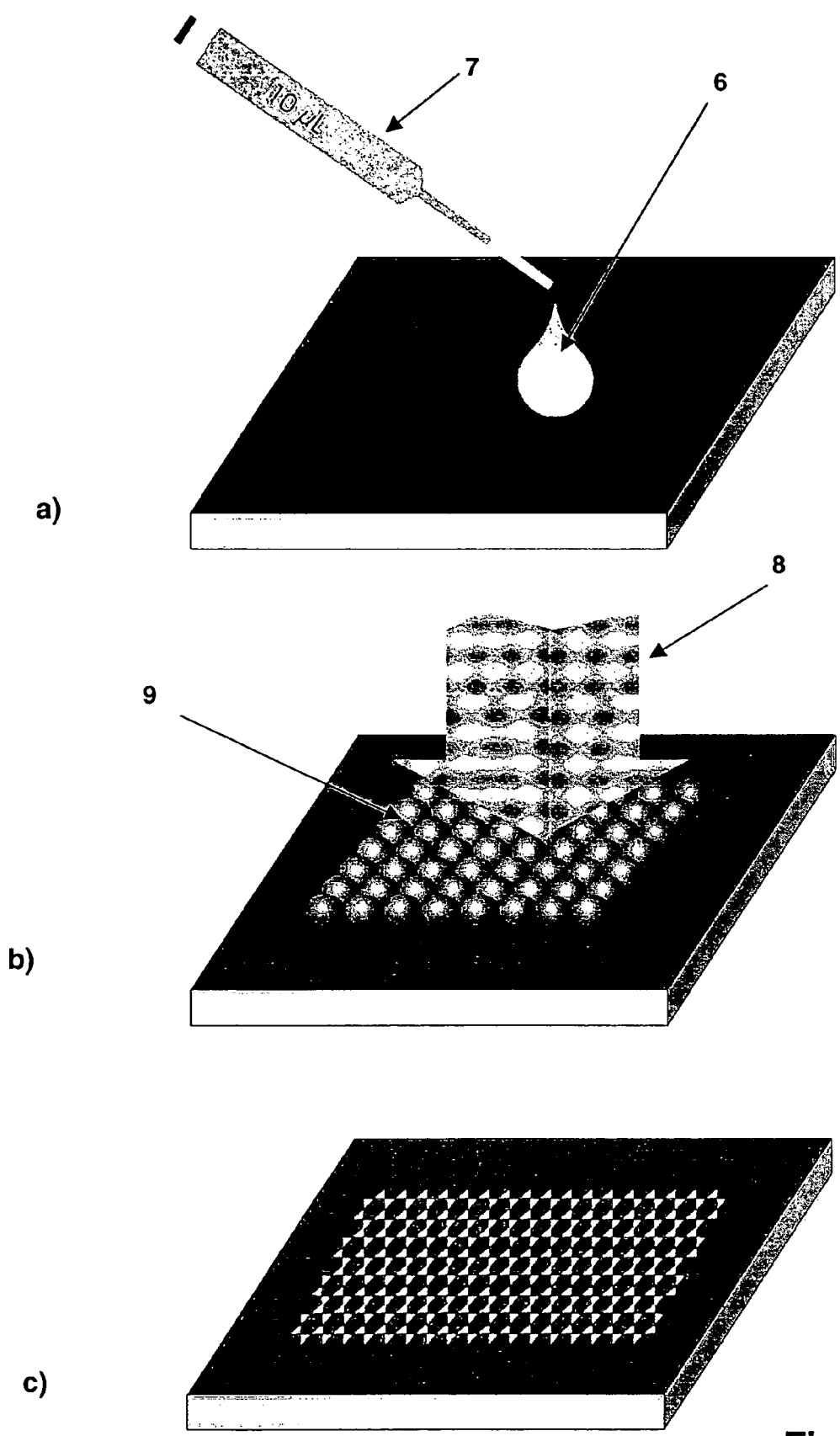
FIGS. 4a) to c) show the production of a mask of colloidal particles and their use as a mask for applying coating seeds.

FIG. 4 shows an alternative masking and coating method to the one described in FIG. 1. In this case, the masking of the support structure 1 occurs before the coating process by means of applying an aqueous suspension of colloidal particles 6. The suspension 6 is applied onto support surface 1 with the aid of conventional microtiter devices 7. The a drying process according to FIG. 4b occurs resulting in a densely packed two-dimensional arrangement of particles on the support surface. This is followed by the coating procedure 8 required for placing crystallization seeds. The colloidal particles 9 remaining on the support surface 1 cover the support surface in such a manner that gaps form between the immediately adjacent colloidal particles 9 corresponding to the aforedescribed openings 3. The size of the particles 9 determines the spacing as well as the size of the openings 3. Preferably, the particles 9 can be composed of polymer materials or inorganic materials, such as for example silicon oxide and usually have a diameter of 50 nm to 50 μm. FIG. 4c shows a coating pattern yielded after the colloidal particles have been coated and correspondingly removed from the support surface 1.

The colloidal particles 9 can be selected in such a manner that their sizes are distributed by an average value (with a monomode size distribution being reached) or by at least two concrete values (with a bimode distribution being reached).

The invention provides novel tools for surface structuring technical and optical surfaces. These tools are, in particular, high-temperature resistant. Furthermore, the applied new, submicrostructured mechanically resistant layers, preferably on steel, have the following advantages: the suitable selection of the material to-be-applied onto the support surface permits obtaining a high-temperature resistance that allows using such molding tools not only for organic glasses but also for inorganic glasses, for example silicate glass.

The coating procedure is not restricted to plane support surfaces. With the aid of the method of the invention practically any desired contour can be coated permitting, in particular producing an antireflective, non-plane optical components, such as for example spheres.

A special variant of the tool designed according to the invention provides structuring the support surface before it is subjected to the coating procedure in the aforedescribed manner. In this case, the support surface is provided with indentations partially or full-surface. At the surface, the diameter of these indentations lies in the range between 1 μm and 30 μm. The indentations reach with approximately the same dimensions into the interior of the support substrate in such a manner that an aspect relationship of approximately 1 is present. The indentations are evenly distributed over the support surface and border each other directly with their on-the-support-surface-lying peripheral edges.

If the preceding measures are met, based on the method of the invention, after fabrication, a tool is obtained for producing technical surfaces can be produced which possess dirt-repelling and or oil-repelling properties.

What is claimed is:

1. A method for producing a tool for creating optically active surface structures in a sub-μm range, including a support surface onto which relief surface structures are applied over the support surface by material deposition, comprising:

directly contacting the support surface with a mask in which openings with diameters in the sub-μm range are provided;

subjecting the support surface including the mask to a coating process in which the coating material deposits through the openings of the mask onto the support surface; and removing the mask from the support surface when a partial amount of an average end structure height of the surface structures is reached and continuing the coating procedure without the mask using the coating materials or different coatings materials, which are deposited onto the entire support surface so that the coating material or different coating materials settles between the surface structures.

2. The method according to claim 1, wherein:

the removal of the mask is carried out when approximately 0.5% to 80% of the average end structure height of the surface structures has been reached.

3. The method according to claim 1, wherein:

the coating is carried out so that surface structures form with lateral structure dimensions decreasing with increasing distance from the support surface.

4. The method according to claim 1, wherein:

producing the openings inside the mask by the support surface being covered with a mask layer and perforating the mask by using one of a photolithographic, electron beam or an ion beam method as well as a selective material removal method.

5. The method according to claim 4, wherein:

the mask material is a photoresist layer or a photosensitive coating.

6. The method according to claim 1, wherein:

applying a suspension with colloidal, bead-shaped particles to form the mask on the support surface after the support surface is dried.

7. The method according to claim 6, wherein:

the colloidal particles are composed of polymer materials or of an inorganic material and have a diameter in the 50 nm to 50 μm size range.

8. The method according to claim 1, wherein:

the mask includes an areal distribution of the openings of 6 to 400 openings per 1 μm².

9. The method according to claim 1, wherein:
the openings are spaced approximately between 50 and 400 nm apart.

10. The method according to claim 1, wherein the coating process is a PVD process in which at least one of the following elements is used as the coating material: Ti, Al, Zr, Cr, Mo, Ni, W, Si, B, or C.

11. The method according to claim 10, wherein for coating the mask and the directly accessible support surface, the elements Ag, Au, Pd, Pt are utilized for developing crystallization seeds.

12. The method according to claim 10, wherein at least one of the elements utilized as the coating material in the continued coating process is at least partially oxidized or nitrated.

* * * * *